(12) United States Patent
Blödt

(10) Patent No.: US 12,000,787 B2
(45) Date of Patent: Jun. 4, 2024

(54) MEASURING DEVICE FOR DETERMINING A DIELECTRIC VALUE

(71) Applicant: Endress+Hauser SE+Co. KG, Maulburg (DE)

(72) Inventor: Thomas Blödt, Steinen (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 97 days.

(21) Appl. No.: 17/757,185

(22) PCT Filed: Nov. 20, 2020

(86) PCT No.: PCT/EP2020/082910
§ 371 (c)(1),
(2) Date: Jun. 10, 2022

(87) PCT Pub. No.: WO2021/115763
PCT Pub. Date: Jun. 17, 2021

(65) Prior Publication Data
US 2023/0003667 A1  Jan. 5, 2023

(30) Foreign Application Priority Data

Dec. 12, 2019  (DE) ...................... 10 2019 134 159.0

(51) Int. Cl.
*G01N 22/00* (2006.01)
*G01N 22/02* (2006.01)
(Continued)

(52) U.S. Cl.
CPC ............. *G01N 22/00* (2013.01); *G01N 22/02* (2013.01); *G01N 22/04* (2013.01); *G01R 27/04* (2013.01); *G01R 27/2658* (2013.01); *G01R 33/60* (2013.01)

(58) Field of Classification Search
CPC ........ G01N 22/00; G01N 22/04; G01N 22/02; G01R 27/04; G01R 27/2658; G01R 33/60
(Continued)

(56) References Cited

U.S. PATENT DOCUMENTS

2010/0102828 A1    4/2010  Bromberg et al.
2018/0024176 A1*   1/2018  Meliani ................. G01N 22/00
                                                          324/629
(Continued)

FOREIGN PATENT DOCUMENTS

DE          19915017 B4   9/2006
DE       102007057092 A1  11/2010
(Continued)

OTHER PUBLICATIONS

DE 102017130728 Machine Translation, Jun. 27, 2019 (Year: 2019).*

*Primary Examiner* — Raul J Rios Russo
(74) *Attorney, Agent, or Firm* — Mark A. Logan; Endress+Hauser (USA) Holding, Inc.

(57) ABSTRACT

A measuring device for determining the dielectric value of a medium in a phase-based manner comprises a measurement section which can be brought into contact with the medium, a signal generation unit for injecting a high-frequency signal at a defined frequency into the measurement section, and an evaluation unit designed to receive a corresponding reception signal after said high-frequency signal passes through the measurement section, to determine a phase shift between the high-frequency signal and the reception signal, and to determine the dielectric value of the medium on the basis of the determined phase shift. The measuring device also comprises at least one filter which transmits the frequency of the high-frequency signal and is arranged such that the received reception signal and/or the generated high-frequency signal is/are filtered. This ensures (Continued)

that the determined dielectric value is not distorted by noise caused by components or the environment.

8 Claims, 3 Drawing Sheets

(51) Int. Cl.
  *G01N 22/04* (2006.01)
  *G01R 27/04* (2006.01)
  *G01R 27/26* (2006.01)
  *G01R 33/60* (2006.01)
(58) Field of Classification Search
  USPC .......................................................... 324/636
  See application file for complete search history.

(56) References Cited

U.S. PATENT DOCUMENTS

| | | | |
|---|---|---|---|
| 2022/0082513 A1* | 3/2022 | Blödt | G01R 27/2623 |
| 2022/0128486 A1* | 4/2022 | Blödt | G01N 27/221 |
| 2022/0283210 A1* | 9/2022 | Blödt | G01R 27/2682 |

FOREIGN PATENT DOCUMENTS

| | | | |
|---|---|---|---|
| DE | 202016008416 U1 | 1/2018 | |
| DE | 102017130728 A1 | 6/2019 | |
| DE | 102018111944 A1 | 11/2019 | |
| DE | 102017130728 A1 | 4/2021 | |
| WO | 2013167384 A1 | 11/2013 | |

* cited by examiner

MEASURING DEVICE FOR DETERMINING A DIELECTRIC VALUE

CROSS-REFERENCE TO RELATED APPLICATIONS

The present application is related to and claims the priority benefit of DPMA Patent Application No. 10 2019 134 159.0, filed on Dec. 12, 2019, and International Patent Application No. PCT/EP2020/082910, filed on Nov. 20, 2020, the entire contents of which are incorporated herein by reference.

TECHNICAL FIELD

The invention relates to a measuring device for the phase-based determination of a dielectric value of a medium.

BACKGROUND

In automation technology, especially for process automation, field devices are often used which serve to capture various measured variables. The measured variable to be determined may, for example, be a fill-level, a flow rate, a pressure, the temperature, the pH value, the redox potential, a conductivity, or the dielectric value of a medium in a process plant. In order to capture the corresponding measured values, the field devices each comprise suitable sensors or are based upon suitable measuring methods. A large number of different types of field devices are manufactured and marketed by the Endress+Hauser group of companies.

The determination of the dielectric value (also known as "dielectric constant" or "relative permittivity") of various media is of great interest both in the case of solids and in the case of liquid and gaseous fillers, such as propellants, wastewater, gases, or chemicals, since this value represents a reliable indicator of impurities, moisture content, or the composition of substances. One possible measuring principle for determining the dielectric value is to measure the phase angle or the phase shift of high-frequency signals. In this case, a high-frequency signal with at least one defined frequency or within a defined frequency band is injected into a measurement section and, after reflection or transmission, a corresponding reception signal is evaluated with respect to its phase position in relation to the transmitted high-frequency signal. The term, "high-frequency signal" or "radar," in the context of this patent application refers to corresponding signals with frequencies between 0.1 GHz and 30 GHz.

A phase-based, dielectric-value measuring device is described, for example, in the publication document DE 10 2017 130728 A1. In this case, the effect is used that the signal velocity and thus the phase angle depends upon the dielectric value of the medium which prevails along the measurement section. In principle, a distinction is drawn between a relative and an absolute phase measurement, wherein, in the case of an absolute phase measurement, a so-called quadrant correction is additionally carried out.

The measurement section can, for example, take the form of a measuring probe within which the high-frequency signal is guided. Otherwise, the measurement section can also be a defined probe region for the medium, which is passed through by the high-frequency signal as a freely-radiated radar signal. Irrespective of the design of the measuring section, however, the measured phase angle is highly dependent upon component-related or environment-related noise in the reception signal, especially due to extraneous irradiation. However, a software-based correction is only possible to a limited extent in this regard, since physically implausible measured values may be generated thereby. Particularly in the case of a broadband relative phase measurement, individual degrees of phase noise can already shift the measured value by several quadrants. This is critical particularly in the case of measuring methods in which a slope of the phase is determined from the phase position, since in this case an offset and slope error results.

SUMMARY

The invention is therefore based upon the aim of providing a robust dielectric-value measuring device which is based upon phase measurement of high-frequency signals.

The invention achieves this aim by a corresponding measuring device for determining the dielectric value of a medium. For this purpose, the measuring device comprises at least the following components:
- a measurement section which can be brought into contact with the medium,
- a signal generation unit which is designed to inject a high-frequency signal with a defined frequency into the measurement section, and
- an evaluation unit designed to:
  - receive the high-frequency signal as a corresponding reception signal after passage through the measurement section,
  - determine, e.g., by means of a network analyzer or a phase detector, such as a Gilbert cell, a phase shift between the high-frequency signal and the reception signal, and
  - determine the dielectric value of the medium on the basis of the determined phase shift.

According to the invention, the measuring device also comprises at least one filter which is permeable to the frequency of the high-frequency signal. Here, the filter is arranged such that the received reception signal and/or the generated high-frequency signal is/are filtered. This ensures that the determined dielectric value is not distorted by component-related or environment-related noise. The filter is preferably to be designed as a high-pass filter. In this case, the high-pass filter(s) can be designed as odd-order filters, in particular of the first order, in such a way that the corresponding high-pass filter blocks below a previously defined lower cutoff frequency and passes above an upper cutoff frequency which is lower than the frequency of the high-frequency signal. Here, it is particularly advantageous to design the high-pass filter(s) in such a way that the high-pass filter(s) below the lower cutoff frequency has/have an approximately constant phase delay. As a result, measurement of the dielectric value is more robust with respect to manufacturing tolerances of the electronic components of the measuring device and with respect to thermal influences.

The frequency or the frequency band at which the signal generation unit of the measuring device according to the invention generates the high-frequency signal is to be set depending upon the medium or as a function of the measuring range. Depending upon the range of the dielectric values, the signal generation unit must therefore accordingly be designed to generate the high-frequency electrical signal at an in particular variable frequency between 0.1 GHz and 30 GHz, and, in the case of aqueous media, preferably between 5 GHz and 8 GHz. The evaluation unit is to be designed correspondingly in order to be able to detect the phase shift at precisely this frequency.

Within the context of the invention, the measuring section can be designed, for example, as an electrically- or dielectrically-conductive measuring probe, wherein, in order to inject the high-frequency signal, the measuring probe is in this case to be contacted with the signal generation unit via a first probe end. With such a design of the measuring section, the measuring probe can also be contacted with the evaluation unit at the first probe end (for example, via a transmitting/receiving switch). As a result, the high-frequency signal at the second, opposite probe end is reflected as a reception signal, whereby it can be received by the evaluation unit.

Alternatively, the measuring probe, lying opposite the signal generation unit, can be contacted with the evaluation unit via the second probe end. In this case, the high-frequency signal, after transmission through the measuring probe, is received by the evaluation unit at the second probe end as a reception signal.

In contrast to a design as a measuring probe, the measurement section can also be conceived as a defined probe region for the medium, which is passed through by the high-frequency signal $s_{HF}$ as a freely-radiated radar signal. For this purpose, the signal generation unit must comprise a transmitting antenna, which is designed to transmit the high-frequency signal as a radar signal. The evaluation unit must include a corresponding receiving antenna. In this case, the antennas are to be arranged or aligned opposite the probe space in such a way that the receiving antenna correspondingly receives the radar signal, after its passage through the medium, as a reception signal.

Within the context of the invention, the term, "unit," is understood to mean, in principle, any electronic circuit that is suitably designed for its intended purpose. Depending upon the requirement, it can therefore be an analog circuit for generating or processing corresponding analog signals. However, it may also be a digital circuit, such as an FPGA or a storage medium, in interaction with a program. In this case, the program is designed to perform the corresponding method steps or to apply the necessary calculation operations of the respective unit. In this context, various electronic units of the dielectric-value measuring device can, in the sense of the invention, potentially also access a common physical memory or be operated by means of the same physical digital circuit.

Corresponding to the dielectric-value measuring device according to the invention according to one of the previously described embodiment variants, the aim is also achieved by a corresponding method for operating the measuring device. Accordingly, the method comprises at least the following method steps:
  injecting the high-frequency signal into the measurement section at a defined frequency,
  receiving a corresponding reception signal after passage through the measurement section,
  filtering the reception signal and/or the high-frequency signal,
  determining a phase shift between the reception signal and the high-frequency signal, and
  determining the dielectric value on the basis of the phase shift.

BRIEF DESCRIPTION OF THE DRAWINGS

The invention is explained in more detail with reference to the following figures. The following are shown.

DETAILED DESCRIPTION

Figure 1:
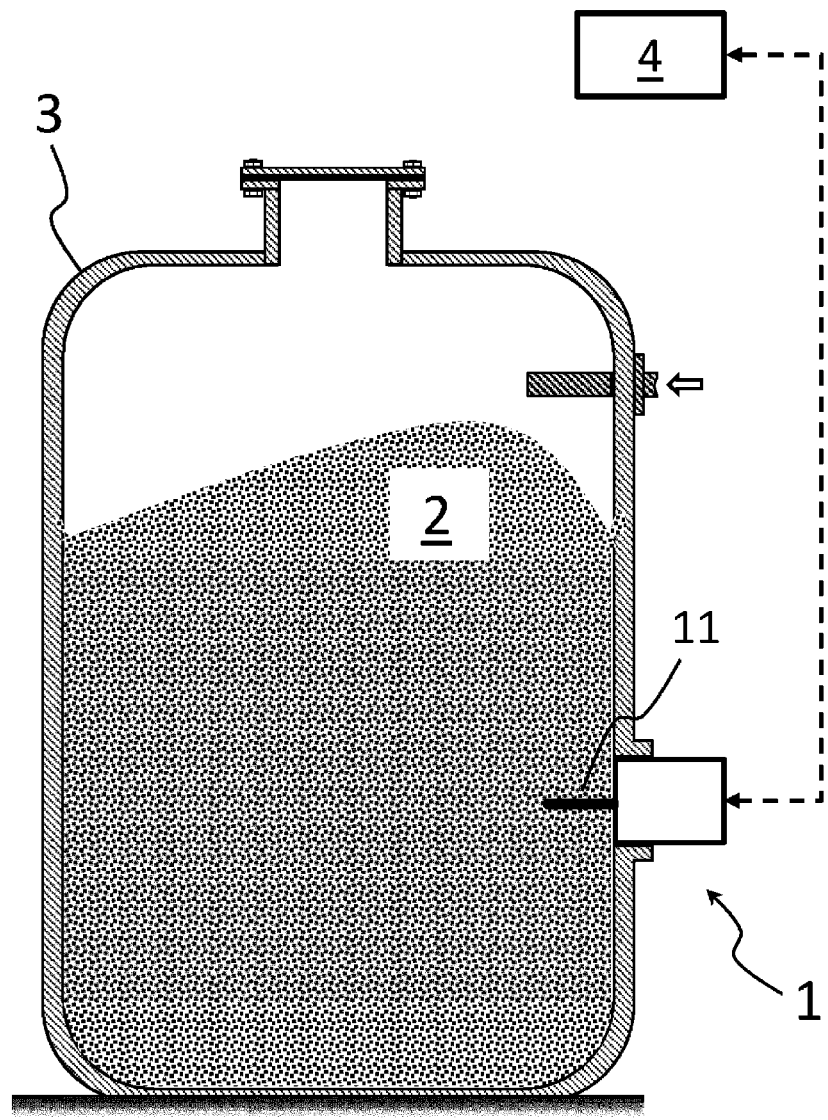
FIG. 1 shows a measuring device according to the invention for dielectric-value measurement of a medium in a container.

For a general understanding of the dielectric-value measuring device 1 according to the invention, a schematic arrangement of the measuring device 1 on a container 3, which is filled with a medium 2, is shown in FIG. 1. To determine the dielectric value of the medium 2, the measuring device 1 is arranged laterally on a connector of the container 3, e.g., on a flange connector. For this purpose, the measuring device 1 is attached to the container inner wall in an approximately form-fitting manner. The material 2 can be liquids such as beverages, paints, cement, or propellants, such as liquid gases or mineral oils. However, the use of the measuring device 1 for bulk-material-type media 2, such as grain for example, is also conceivable.

The measuring device 1 can be connected to a higher-level unit 4, such as, for example, a process control system. As interface, "PROFIBUS," "HART," or "Wireless HART" can, for example, be implemented. The dielectric value can be transmitted via these as an absolute value, or complex-valued with a real part and an imaginary part. However, other information about the general operating state of the measuring device 1 can also be communicated.

As shown schematically in FIG. 1, the measuring device 1 comprises a measuring probe 11, which, after installation, extends into the interior of the container 3. In this way, the measuring probe 11 is in contact with the medium 2 at a corresponding minimum fill-level of the medium 2, so that the measuring device 1 can determine the dielectric value of the medium 2 via the measuring probe 11.

Basically, the measuring device 1 is based upon a high-frequency signal $s_{HF}$ which is injected into the measuring probe 11, whereby the electromagnetic near-field of the high-frequency signal $s_{HF}$ penetrates the medium 2. For this purpose, the measuring probe 11 is designed to be electrically- or dielectrically-conductive, so that a correspondingly-designed signal generation unit 12 of the measuring device 1 (see FIG. 2) can inject the high-frequency signal $s_{HF}$ into a first probe end 111. Here, the probe geometry or the length d must be adapted to the corresponding medium 2. The signal generation unit 12 can be based, for example, upon a controllable high-frequency oscillator, the frequency of which is regulated by a "phase-locked loop." The frequency $f_{HF}$ or the frequency band of the high-frequency signal $s_{HF}$ is to be matched to the specific type of medium 2 or to the specific value range of the dielectric value to be measured. Accordingly, a frequency $f_{HF}$ between 0.433 GHz and 6 GHz is suitable for media 2 which have a high water content. The advantage of using several different individual frequencies or one frequency band is, for one, the possibility of additionally determining the density of the medium 2. On the other hand, in the case of negative interference at a specific individual frequency, it can be possible to switch over to alternative individual frequencies.

Figure 2:
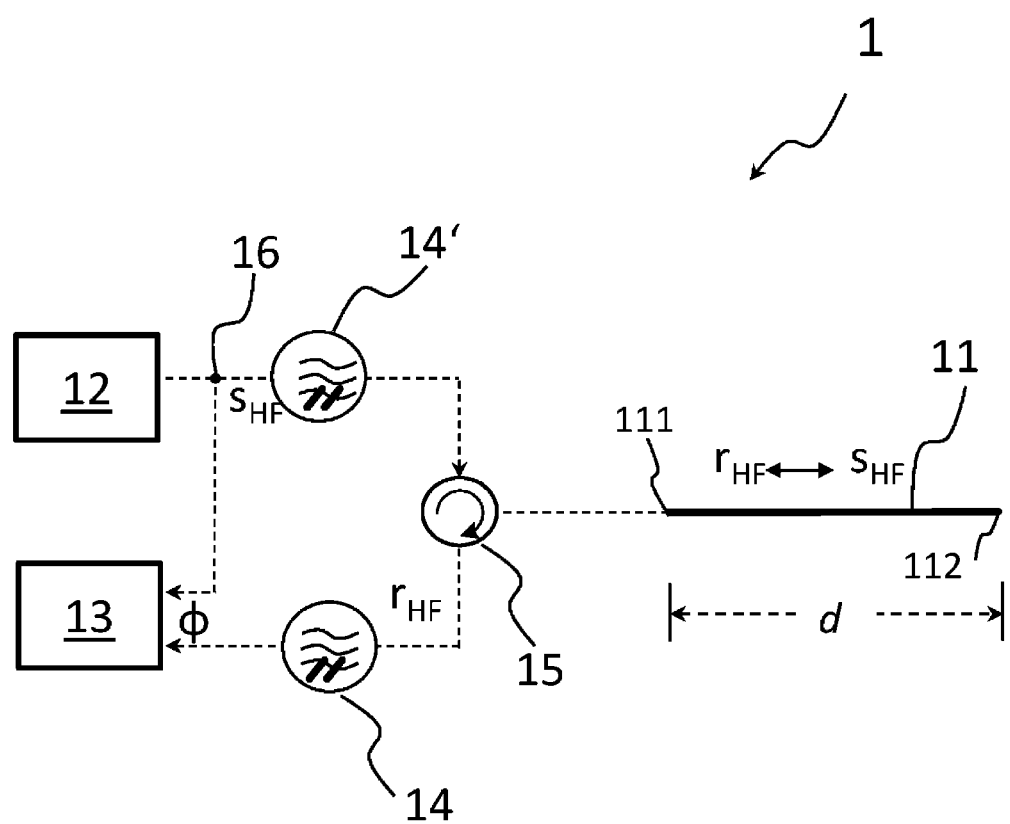
FIG. 2 shows a basic circuit diagram of the measuring device according to the present disclosure.

On the basis of a reception signal $r_{HF}$ correspondingly reflected at the opposite, second probe end 112 of the measurement probe 11, the dielectric value of the medium 2 can be determined by an evaluation unit 13, wherein the evaluation unit 13 in the exemplary embodiment shown in FIG. 2 is in turn connected for this purpose to the first probe end 111. To split the signals $s_{HF}$, $r_{HF}$, the signal generation unit 12 and the evaluation unit 13 are connected to the first probe end 111 via a transmitting/receiving switch. Instead of the evaluation unit 13 being contacted at the first probe end 111, as shown in FIG. 2, the evaluation unit 13 can in principle also be connected to the opposite, second probe end 112. In this case, the evaluation unit 13 receives as a reception signal $r_{HF}$ the transmitted portion of the injected high-frequency signal $s_{HF}$, so that a transmitting/receiving switch 15 is not necessary at the first probe end 111.

Differing from the measuring probe 11 shown in FIG. 2, a probe range for the medium 2 can alternatively also be defined as a measurement section, as shown for example in the publication document DE 10 2017 130728 A1. Here, the measurement section is defined by a transmitting antenna for transmitting the high-frequency signal $s_{HF}$ as a radar signal, and by a receiving antenna for receiving the corresponding reception signal $r_{HF}$. For this purpose, the antennas are arranged or aligned opposite one another at a corresponding distance d.

To determine the dielectric value of the medium 2, the evaluation unit 13 determines a phase shift φ between the injected high-frequency signal $s_{HF}$ and the reception signal $r_{HF}$. In this case, the evaluation unit 13 can carry out an absolute phase measurement, i.e., between a phase shift of 0° and, theoretically, infinity. Alternatively, the phase measurement is carried out as a relative measurement between 0° and 360°, i.e., without additional quadrant correction. For the purpose of comparing the phase shift φ in relation to the phase angle of the high-frequency signal $s_{HF}$, the evaluation unit 13, as shown in FIG. 2, can be coupled to the signal generation unit 12 via a signal divider 16. In this case, for measuring the phase shift φ, the evaluation unit 13 can comprise, for example, a network analyzer or a phase detector, such as a Gilbert cell. With the aid of the measured phase shift φ, the evaluation unit 13 can in turn determine the dielectric value of the medium 2, e.g., on the basis of a corresponding calibration measurement series.

The measurement principle of the phase-based measurement of dielectric value shown in FIG. 2 offers the advantage that the dielectric value can be determined with high sensitivity. However, this measuring principle is also susceptible to noise sources internal or external to components. According to the invention, the measuring device 1 therefore comprises a first high-pass filter 14, permeable to the frequency $f_{HF}$ of the high-frequency signal $s_{HF}$, which is arranged in the reception path upstream of the evaluation unit 13. For this purpose, the first high-pass filter 14 is tuned to the high-frequency signal $s_{HF}$ in such a way that, below a defined, lower cutoff frequency $f_{g,l}$, the corresponding signal components of the high-frequency signal $s_{HF}$ are suppressed by at least −10 dB, and in particular at least −80 dB. Above a defined, upper cutoff frequency $f_{g,h}$ that is lower than the frequency $f_{HF}$ of the high-frequency signal $s_{HF}$ or of the reception signal $r_{HF}$, the first high-pass filter 14 conducts the reception signal $r_{HF}$ with an attenuation as low as possible of at most −10 dB. This characteristic is shown schematically in the graph of FIG. 3. Any noise that can impair the determination of the dielectric value is thus suppressed by the first high-pass filter 14 in the reception signal $r_{HF}$.

For the same reason, in the embodiment variant of the measuring device 1 shown in FIG. 2, a second high-pass filter 14' is also arranged in the signal path of the high-frequency signal $s_{HF}$ between the signal generation unit 12 and the transmitting/receiving switch 15. Here, the second high-pass filter 14' also preferably has the filter characteristics shown in FIG. 3. Instead of the two high-pass filters 14, 14', it is also conceivable to arrange a corresponding filter between the transmitting/receiving switch 15 and the first probe end 111 of the measuring probe 11 (not shown in FIG. 2).

Figure 3:
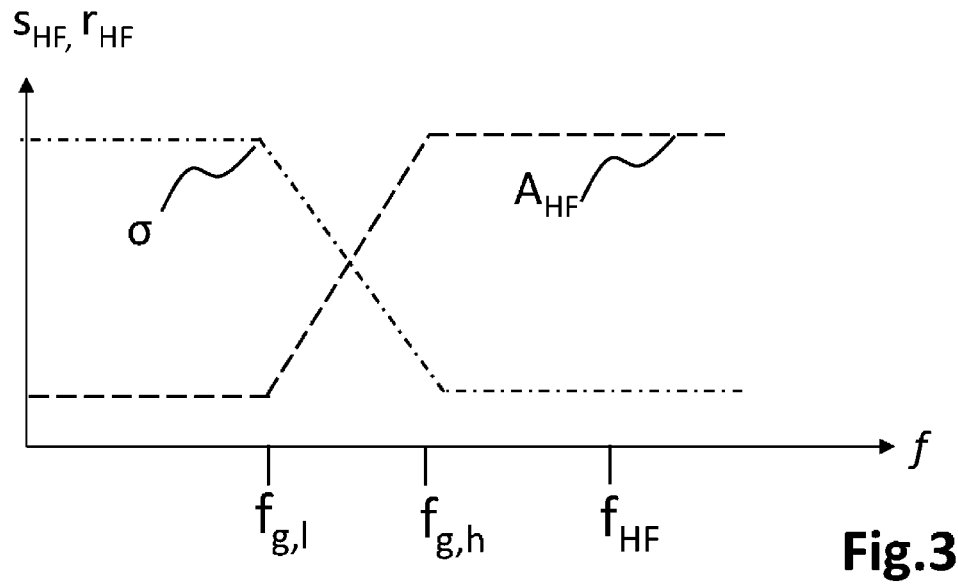
FIG. 3 shows a graph of the amplitude and phase spectra of the filter.

FIG. 3 also shows a further advantageous design of the two high-pass filters 14, 14': Accordingly, below the lower cutoff frequency $f_{g,l}$, corresponding signal components of the high-frequency signal $s_{HF}$ between input and output of the high-pass filter 14 are delayed with a phase delay σ between, in particular, 30° and 200°, which is approximately constant in relation to the frequency $f_{HF}$. Above the lower cutoff frequency $f_{g,l}$, the phase delay σ decreases linearly in the schematic representation, so that the high-pass filter 14 passes the reception signal $r_{HF}$ above the upper cutoff frequency $f_{g,h}$ without any significant phase delay σ, i.e., less than 10°. This frequency-dependent phase behavior results in the advantage that measurement of the dielectric value is more robust with respect to manufacturing tolerances of the electronic components of the measuring device and with respect to thermal influences.

Figure 4:
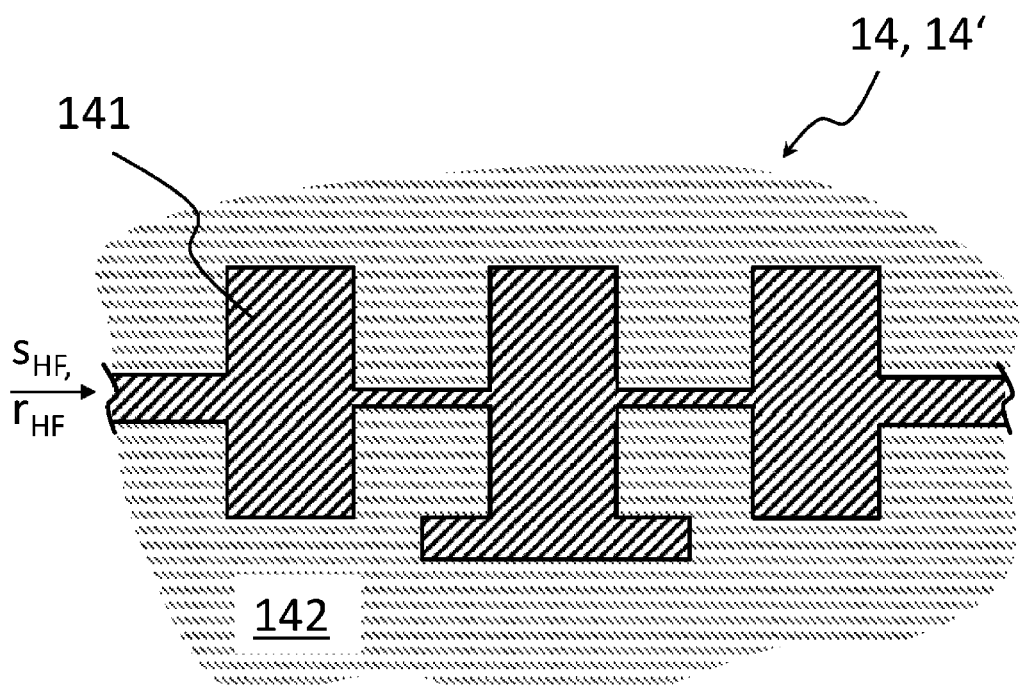
FIG. 4 shows a possible realization of the filter according to the present disclosure.

A possible variant for implementing the high-pass filter 14, which has the properties shown in FIG. 3, is shown in FIG. 4. In this variant, the high-pass filter 14 is designed as a two-dimensional conductor track structure 141 on a printed circuit board substrate 142. For example, a structurable copper or silver layer can be used as the conductor track material. Characteristic of the conductor track structure 141 here is a serial arrangement of three rectangles, which are in principle of the same area and which, in comparison to external contact, are connected to one another by two conductor tracks which are tapered by approximately ⅔. In this case, the signal $r_{HF}$, $s_{HF}$ to be filtered is supplied via one of the two external contacts and, after corresponding filtering, tapped via the other external contact. Due to the symmetrical design in the path direction of the high-pass filter 14, 14' illustrated in FIG. 4, it is in principle irrelevant which of the two external contacts serves as input or as output.

As shown in FIG. 4, in contrast to the two outer rectangles, the middle rectangle has an asymmetry in the form of a supplementary structure at one end. As a result, the high-pass filter 14 forms corresponding properties of odd order, so that the frequency-dependent transmission behavior of signal amplitude $A_{HF}$ shown in FIG. 3 results. It goes without saying that the high-pass filter 14, 14' can also be realized in hybrid fashion with a corresponding odd order instead of the embodiment variant shown in FIG. 4.

LIST OF REFERENCE SIGNS

1 Measuring device
2 Medium
3 Container
4 Higher-level unit
11 Measurement probe
12 Signal generation unit
13 Evaluation unit
14, 14' Filter
15 Transmitting/receiving switch
16 Signal divider
111 First probe end
112 Second probe end
141 Conductor track structure
142 Printed circuit board substrate
$A_{HF}$ Signal strength at filter
d Length of the measurement probe $f_{HF}$ Frequency of the high-frequency or reception signal
$f_{g,l}$ Lower cutoff frequency
$f_{g,h}$ Upper cutoff frequency
$r_{HF}$ Reception signal
$s_{HF}$ High-frequency signal
φ Phase shift
σ Phase delay

The invention claimed is:

1. A measuring device for determining a dielectric value of a medium, comprising:
    a measurement section that can be brought into contact with the medium;
    a signal generation unit designed to inject a high-frequency signal having a defined frequency into the measurement section;
    an evaluation unit designed to:
        receive a corresponding reception signal after passage through the measurement section;
        determine a phase shift between the high-frequency signal and the reception signal; and
        on the basis of the determined phase shift, determine the dielectric value of the medium; and
    a first high-pass filter and a second high-pass filter, each of the first and second high-pass filters permeable to the defined frequency of the high-frequency signal and arranged such that the received reception signal and the generated high-frequency signal are filtered,
    wherein the first and second high-pass filters are each designed as a filter of odd order such that the corresponding first and second high-pass filter blocks below a lower cutoff frequency and passes above an upper cutoff frequency that is lower than the defined frequency of the high-frequency signal, and
    wherein the first and second high-pass filters below the lower cutoff frequency have a constant phase delay.

2. The measuring device according to claim 1, wherein the evaluation unit includes a network analyzer or a phase detector for determining the phase shift.

3. The measuring device according to claim 1, wherein the signal generation unit is designed to generate the high-frequency electrical signal with a variable frequency between 0.1 GHz and 30 GHz, and wherein the evaluation unit is designed to detect the phase shift at the corresponding frequency.

4. The measuring device according to claim 1, wherein the measurement section is designed as an electrically- or dielectrically-conductive measuring probe that is contacted with the signal generation unit via a first probe end in order to inject the high-frequency signal.

5. The measuring device according to claim 3, wherein the electrically-or dielectrically-conductive measuring probe is contacted with the evaluation unit via the first probe end such that, at a second probe end opposite the first probe end, the high-frequency signal is reflected as a reception signal.

6. The measuring device according to claim 4, wherein the electrically-or dielectrically-conductive measuring probe is contacted, via the second probe end, with the evaluation unit such that the high-frequency signal is transmitted as a reception signal to the second probe end.

7. The measuring device according to claim 1, wherein the signal generation unit includes a transmitting antenna designed to transmit the high-frequency signal as a radar signal, wherein the evaluation unit includes a receiving antenna, and wherein the antennas are arranged and aligned opposite to each other on the measurement section such that the receiving antenna correspondingly receives the radar signal, after passage through the medium, as the reception signal.

8. A method for determining a dielectric value of a medium, comprising:
    providing a measuring device for determining the dielectric value of a medium, including:
        a measurement section that can be brought into contact with the medium;
        a signal generation unit designed to inject a high-frequency signal having a defined frequency into the measurement section;
        an evaluation unit designed to:
            receive a corresponding reception signal after passage through the measurement section;
            determine a phase shift between the high-frequency signal and the reception signal; and
            on the basis of the determined phase shift, determine the dielectric value of the medium; and
        a first high-pass filter and a second high-pass filter, each of the first and second high-pass filters permeable to the defined frequency of the high-frequency signal and arranged such that the received reception signal and the generated high-frequency signal are filtered,
        wherein the first and second high-pass filters are each designed as a filter of odd order such that the corresponding first and second high-pass filter blocks below a lower cutoff frequency and passes above an upper cutoff frequency that is lower than the defined frequency of the high-frequency signal, and
        wherein the first and second high-pass filters below the lower cutoff frequency have a constant phase delay;
    injecting the high-frequency signal into the measurement section at the defined frequency;
    receiving the corresponding reception signal after passage through the measurement section;
    filtering the reception signal and the high-frequency signal;
    determining a phase shift between the filtered reception signal and the filtered high-frequency signal; and
    determining the dielectric value on the basis of the phase shift.

* * * * *